United States Patent
Kubota

(10) Patent No.: US 6,521,476 B2
(45) Date of Patent: Feb. 18, 2003

(54) METHOD FOR MANUFACTURING A SEMICONDUCTOR OPTICAL FUNCTIONAL DEVICE

(75) Inventor: Munechika Kubota, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/978,053

(22) Filed: Oct. 17, 2001

(65) Prior Publication Data

US 2002/0187579 A1 Dec. 12, 2002

(30) Foreign Application Priority Data

Jun. 11, 2001 (JP) ........................................ 2001-175840

(51) Int. Cl.$^7$ .............................................. H01L 21/00
(52) U.S. Cl. .............................. 438/39; 438/22; 438/41; 438/46; 438/47; 438/40
(58) Field of Search .............................. 438/22, 39, 40, 438/41, 46, 47

(56) References Cited

PUBLICATIONS

M. Aoki et al., "High–Power and Wide–Temperature–Range . . . Ridge–Waveguide Structure", IEEE Photonics Tech. Letters, vol. 7, No. 1, Jan. 1995.*

K. Yamada et al., "Low polarisation dependency . . . with an InGaAsP bulk absorption layer", Electronics Letters, Feb. $2^{nd}$ 1995, vol. 31, No. 3.*

Jie et al., "Native–Oxidized InAlAs Blocking Layer Buried Heterostructure INGaAsP–IOnP MQW Laser for High–Temperature Operation," IEEE Photonics Technology Letters, vol. 11, No. 1, Jan. 1999, pp. 3–5.

Aoki et al., "InP–Based Reversed–Mesa Ridge–Waveguide Structure for High–Performance Long–Wavelength Laser Diodes," IEEE Journal of Selected Topics in Quantum Electronics, vol. 3, No. 2, Apr. 1997, pp. 672–683.

* cited by examiner

Primary Examiner—Long Pham
(74) Attorney, Agent, or Firm—Volentine Francos, PLLC

(57) ABSTRACT

A method for manufacturing a semiconductor optical functional device, comprising: forming a laminated semiconductor layer over a substrate; forming an island-form preliminary pattern whose side wall surface is substantially perpendicular to the upper surface of the substrate by patterning all or part of the laminated semiconductor layer; forming an insulating material component on the top side of the substrate so that the upper surface of the preliminary pattern and part of the side walls of the preliminary pattern are exposed; and etching the side walls of the preliminary pattern and thereby changing the preliminary pattern into a reversed-mesa structure component that contributes to optical function and forming a space between the reversed-mesa structure component and the insulating material component.

7 Claims, 4 Drawing Sheets though—and this is called a preliminary pattern because it is not in the form of a reversed mesa. The upper surface of this preliminary pattern has substantially the same size and shape as the upper surface of the reversed-mesa structure component. Next, in (3), the insulating material component is formed on the sides of the preliminary pattern. This insulating material component serves to flatten the device, for example. When a thermoplastic resin such as a polyimide is used as the material that makes up this insulating material component, for example, the sides of the preliminary pattern are coated with this material and then heated and cured during this (3).

METHOD FOR MANUFACTURING A SEMICONDUCTOR OPTICAL FUNCTIONAL DEVICE

BACKGROUND OF THE INVENTION

1. Field of the Invention

The present invention relates to a method for manufacturing a semiconductor optical functional device used in optical communications systems and optical information systems.

2. Description of Related Art

Up to now, semiconductor optical functional devices corresponding to light in the long wavelength band used in optical communications have primarily had a BH (buried hetero) structure, as discussed in Publication 1, for example (Publication 1: "Native-Oxidized InAlAs Blocking Layer Buried Heterostructure InGaAsP-InP MQW Laser for High-Temperature Operation," IEEE Photonics Technology Letters, Vol. 11, No. 1, January 1999). However, the manufacture of devices with a BH structure requires a crystal growth step to be repeated a number of times, and furthermore the manufacturing process is somewhat complicated. In view of this, considerable effort in recent years has gone into the development of semiconductor functional devices with a ridge-type structure, which require only a single crystal growth step and can be manufactured more easily than a device with a BH structure, as discussed, for example, in Publication 2 (Publication 2: "InP-Based Reversed-Mesa Ridge-Waveguide Structure for High-Performance Long-Wavelength Laser Diodes," IEEE Journal of Selected Topics in Quantum Electronics, Vol. 3, No. 2, April 1997).

With these semiconductor functional devices having a ridge-type structure, a plurality of reversed-mesa structures are successively formed adjacent to each other. A polyimide resin is provided not only in between these ridge-type reversed-mesa structures, but also in contact with the side walls of the reversed-mesa structures on both sides of the reversed-mesa structures in order to reduce parasitic capacitance and make the device flatter. Annealing is performed in the step in which this polyimide resin is provided in order to cure the polyimide resin that coats the upper surface of a semiconductor wafer. Heat causes the polyimide resin to expand or contract during this annealing, and this subjects the side walls of the reversed-mesa structure to stress. If an active layer is provided in the vicinity of the side walls of the reversed-mesa structure, this stress may have an adverse effect on the reliability of the optical functional device.

There are also semiconductor optical functional devices with a ridge-type structure that have what is known as an air bridge, in which the upper surface of one mesa portion and the upper surface of an adjacent mesa portion are bridged by an electrode pad, without both sides of the mesa portions being covered with a polyimide resin.

In devices having an air bridge, though, there is the danger of damage to the device occurring (in which the electrode pads may break, or the mesa portions snap) in the step of polishing the back of the wafer, for instance, in the course of wire bonding or junction down mounting.

SUMMARY OF THE INVENTION

Therefore, it is an object of the invention to provide a method for manufacturing a device which does not subject the side walls of the mesa portion to stress.

To achieve the stated object, the method of the present invention for manufacturing a semiconductor optical functional device comprises:

(1) forming a laminated semiconductor layer over a substrate;

(2) forming an island-form preliminary pattern whose side wall surface is substantially perpendicular to the upper surface of the substrate by patterning all or part of the laminated semiconductor layer;

(3) forming an insulating material component on the top side of the substrate so that the upper surface of the preliminary pattern and part of the side walls of the preliminary pattern are exposed; and (4) etching the side walls of the preliminary pattern and thereby changing this preliminary pattern into a reversed-mesa structure component that contributes to optical function and forming a space between the reversed-mesa structure component and the insulating material component.

In the above-mentioned (1), a semiconductor layer that will subsequently become the reversed-mesa structure component that contributes to optical function is formed over a substrate, and then in (2) this semiconductor layer is patterned to obtain a preliminary pattern. The side wall surface of this preliminary pattern is substantially perpendicular to the upper surface of the substrate, and this is called a preliminary pattern because it is not in the form of a reversed mesa. The upper surface of this preliminary pattern has substantially the same size and shape as the upper surface of the reversed-mesa structure component. Next, in (3), the insulating material component is formed on the sides of the preliminary pattern. This insulating material component serves to flatten the device, for example. When a thermoplastic resin such as a polyimide is used as the material that makes up this insulating material component, for example, the sides of the preliminary pattern are coated with this material and then heated and cured during this (3).

Next, in (4), the side walls of the preliminary pattern are etched so as to change the preliminary pattern into a reversed-mesa structure component. In order to etch the side walls of the preliminary pattern, the insulating material component is formed in (3) so that part of the side walls of the preliminary pattern will be exposed from the insulating material component. A reversed-mesa structure component is then obtained by etching the entire side wall the portion where the side wall of the preliminary pattern is partially exposed. This etching forms a space, which widens from the upper surface toward the substrate, between the reversed-mesa structure component and the insulating material component. As a result, the area around the neck portion of the reversed-mesa structure component is covered by air, so there is no danger of strain occurring.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

Figure 1:
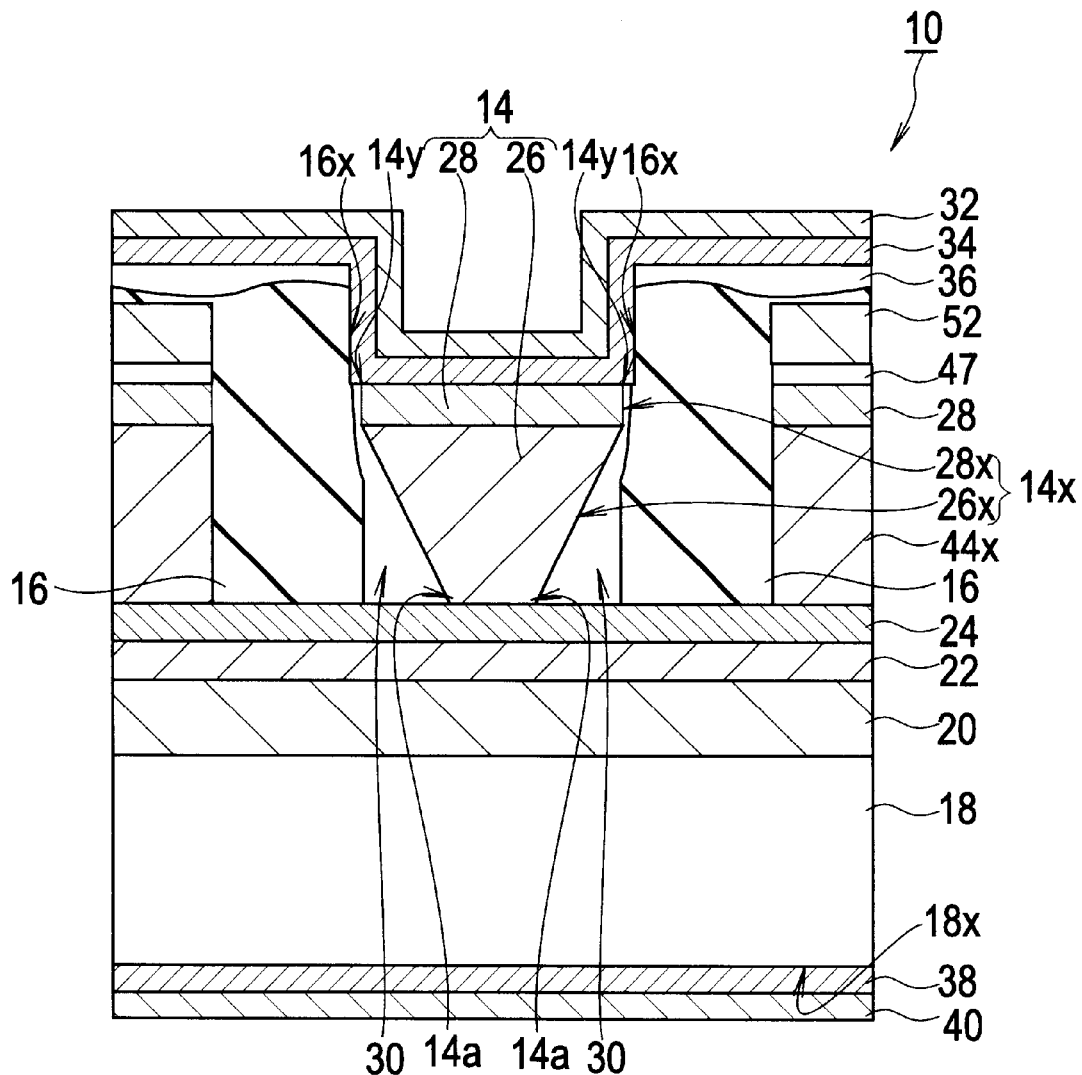
FIG. 1 is a cross sectional view for explaining a simplified structural diagram of a semiconductor laser in an embodiment of the present invention.

Embodiments of the present invention will now be described with reference to the drawings. The drawings are nothing more than simplified illustrations of the shape, size, and dispositional relationships of the various structural components, provided to afford a better understanding of the invention, and the present invention is therefore not limited to or by the examples given in the drawings. In the drawings, some of the hatching (diagonal lines) indicating a cross section has been omitted in an effort to make the drawings easier to understand.

Examples of applying the present invention to the structure of a semiconductor laser will now be described through reference to FIGS. 1 to 4 as embodiments of the present invention.

FIG. 1 is a simplified structural diagram of a semiconductor laser in an embodiment of the present invention, and is a cross section. FIGS. 2(A) to 2(C) to 4(A) to 4(C) are simplified diagrams of the formation of the semiconductor laser in FIG. 1, and are cross sections of the structure in each of the main formation stages.

In the structural example shown in FIG. 1, the semiconductor laser 10 in this embodiment comprises a substrate 18, a reversed-mesa structure component 14 formed on the top side of the substrate 18, and an insulating material component 16 that is formed on the top side of the substrate 18 and in the vicinity of the side wall surface 14x of the reversed-mesa structure component 14.

In this embodiment, the substrate 18 is a first conductivity type substrate, and a first conductivity type cladding layer 20, an active layer 22, and a second conductivity type etching stop layer 24 are built up in that order over this substrate 18. In this example, the first conductivity type is n-type and the second conductivity type is p-type. To give a more specific example of the structure of the substrate 18 and the components provided on the substrate 18, an n-InP cladding layer 20 with a thickness of 0.5 μm, an InGaAsP active layer 22 with a thickness of 0.122 μm, and a p-InAlAs etching stop layer 24 are formed in that order over an n-InP substrate 18.

The reversed-mesa structure component 14 comprises, for example, a second conductivity type cladding layer 26 and a second conductivity type contact layer 28. In a more specific example, it comprises a p-InP cladding layer 26 with a thickness of 2 μm and a p-InGaAs contact layer 28 with a thickness of 0.2 μm. The side walls 26x of the p-InP cladding layer 26 constitute a reversed-mesa structure in the (111) A plane direction.

A space 30 is interposed between the side wall surface 14x of the reversed-mesa structure component 14 and the insulating material component 16. Specifically, this insulating material component 16 is provided so as to bury the area surrounding the reversed-mesa structure component 14 and so as not to be in contact with the reversed-mesa structure component 14. The space 30 between the insulating material component 16 and the reversed-mesa structure component 14 is preferably the minimum gap at which no stress will be transmitted between the material component 16 and the structure component 14. It is also favorable for the gap width between the material component 16 and the structure component 14 to successively narrow from the substrate side of the constricted portion of the structure component 14 toward the top side of the constricted portion.

An insulating resin is preferably used as the material that makes up the insulating material component 16, and a polyimide resin is used in this embodiment. In this embodiment, the side wall 16x of the insulating material component 16 facing the side wall surface 14x of the reversed-mesa structure component 14 is formed substantially perpendicular to the upper surface of the substrate 18. The gap is smallest between the edge 14y of the upper surface of the reversed-mesa structure component 14 and the side wall 16x of the insulating material component 16, and is about 0.2 to 0.3 μm in this embodiment. In contrast, the gap between the neck 14a of the reversed-mesa structure component 14 and the side wall 16x of the insulating material component 16 is largest so that the side wall surface 14x of the reversed-mesa structure component 14 will be formed in the direction of the (111) A plane. Also, the width of the upper surface of the reversed-mesa structure component 14 (also called the mesa width) is 5 μm in this embodiment.

With the semiconductor laser 10 in this embodiment, an electrode pad 32 is formed continuously from over the p-InGaAs contact layer 28 of the reversed-mesa structure component 14 to the top side of the insulating material component 16. This electrode pad 32 is made from a Ti/Pt/Au laminated metal film. In this embodiment, a laminated metal film composed of Au/Zn/Au is provided as an ohmic electrode 34 on the underside of the electrode pad 32. An $SiO_2$ insulating film 36 is provided over the polyimide resin serving as the insulating material component 16, and the ohmic electrode 34 is formed via this $SiO_2$ insulating film 36. A laminated metal film composed of Au/Ge/Ni is formed as an ohmic electrode 38 on the back side 18x of the n-InP substrate 18, and a laminated metal film composed of Ti/Pt/Au is provided as an electrode pad 40 over this ohmic electrode 38 (FIG. 1).

With the above structure of the semiconductor laser 10, the periphery of the side wall surface 14x of the reversed-mesa structure component 14 is the space 30. This space 30 may be a vacuum, or it may be filled with a gas capable of minimizing the parasitic capacitance of the semiconductor laser. In the structural example of this embodiment, the periphery of the reversed-mesa structure component 14 is covered with air. Air has a lower dielectric constant than a polyimide resin. Thus, the parasitic capacitance of the semiconductor laser 10 in this embodiment is about the same as that of a ridge-type semiconductor laser having an air bridge, and is less than that of an device constructed such that the periphery of the reversed-mesa structure component is covered by an insulating material such as a polyimide resin. Also, the neck 14a of the reversed-mesa structure component 14 is not subjected to any stress originating in the insulating material. It is therefore less likely that strain will occur in this neck 14a portion.

The insulating material component 16 is formed in the vicinity of the side wall surface 14x of the reversed-mesa structure component 14 with the space 30 interposed therebetween. As is clear from FIG. 1, the insulating material component 16 is extremely close to the edge 14y of the upper surface of the reversed-mesa structure component 14. Thus, the space 30 near the edge 14y of the reversed-mesa structure component 14 does not constitute as a step that would compromise the flatness of the device. Therefore, the insulating material component 16 is able to reduce the step between the upper surface of the reversed-mesa structure component 14 and the upper surface of the area around this structure component 14. Referring to FIG. 1, in the structural example in this embodiment, it looks as though a step is formed between the upper surface of the reversed-mesa structure component 14 and the upper surface of the insulating material component 16, but this step is far smaller than the step between the upper surface of the reversed-mesa structure component 14 and the upper surface of the second conductivity type etching stop layer 24 that is formed when the insulating material component 16 is not provided. Thus, the flatness of the device 10 is substantially preserved. The strength in terms of the mounting of the device 10 is therefore higher than that of a semiconductor laser having an air bridge. Accordingly, the semiconductor laser 10 has higher reliability and the yield is also higher than in the past.

An example of a method for manufacturing a semiconductor laser such as this will now be described with reference to FIGS. 2 to 4.

First, the first conductivity type cladding layer 20, the active layer 22, and the second conductivity type etching stop layer 24 are deposited on the first conductivity type substrate 18. This is followed by the deposition of a second conductivity type first film 44 and then a second conductivity type second film 46 that together serve as a semiconductor layer 42 for forming the reversed-mesa structure component.

Therefore, in this embodiment, MOCVD is used to form the n-InP cladding layer 20 in a thickness of 0.5 $\mu$m over the n-InP substrate 18, and then form the InGaAsP active layer 22 in a thickness of 0.122 $\mu$m. After this, the p-InAlAs etching stop layer 24, the p-InP film 44 (2 $\mu$m thick), and the p-InGaAs film 46 (0.2 $\mu$m thick) are formed over the InGaAsP active layer 22 (FIG. 2(A)).

Figure 2A:
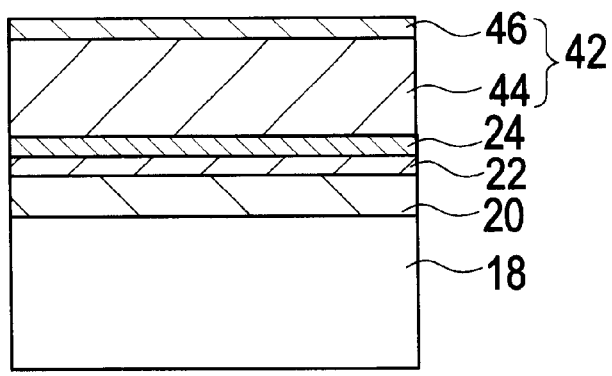
FIGS. 2(A) to (C) are diagrams for explaining the manufacture of the semiconductor laser in FIG. 1.
Figure 2B:
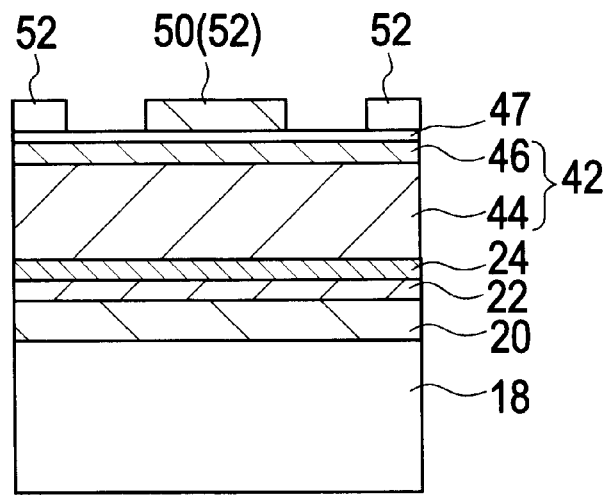
Figure 2C:
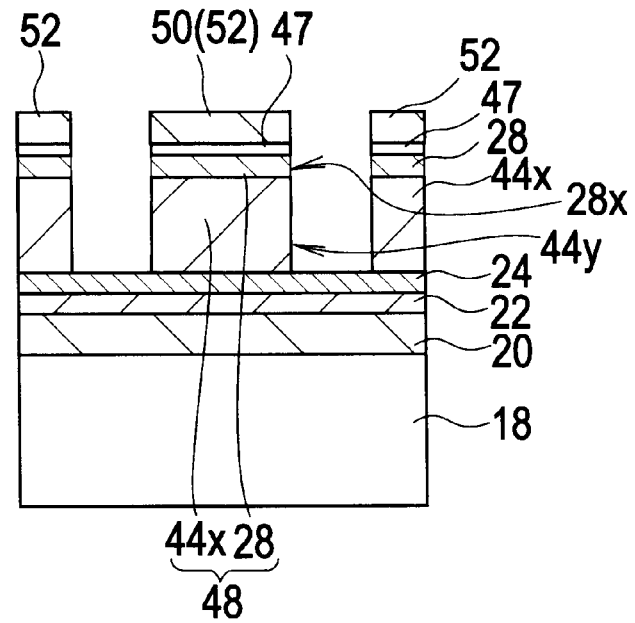

The semiconductor layer 42 for forming the reversed-mesa structure component is then patterned to form a preliminary pattern 48 for forming the reversed-mesa structure component (see FIG. 2(C)).

Accordingly, in this embodiment, first, an SiO$_2$ film 47 is formed by plasma CVD (p-CVD) over the p-InGaAs film 46. After this, a first mask 52 is provided on the top side of the p-InGaAs film 46, that is, over the SiO$_2$ film 47, by a standard photolithography process (FIG. 2(B)). This first mask 52 has an island pattern 50 consisting of stripes 5 $\mu$m wide as the shape corresponding to the pattern on the upper surface of the reversed-mesa structure component. Next, the SiO$_2$ film 47 is removed from the region exposed through the first mask 52.

Next, the portion of the second conductivity type second film 46 exposed through the first mask 52 is etched away until the upper surface of the second conductivity type etching stop layer 24 is exposed (see FIG. 2(C)). To this end, the use of the first mask 52 is made to etch away first the p-InGaAs film 46 and then the underlying p-InP film 44 by RIE. This etching consists of anisotropic etching perpendicular to the upper surface of the substrate 18, and exposes the upper surface of the p-InAlAs etching stop layer 24 under the p-InP film 44. This yields the preliminary pattern 48 for forming the reversed-mesa structure component, including the remaining portion 28 of the p-InGaAs film (the p-InGaAs contact layer) and the remaining portion 44x of the p-InP film. The side wall surface of this preliminary pattern 48 is substantially perpendicular to the upper surface of the substrate 18.

Figure 3A:
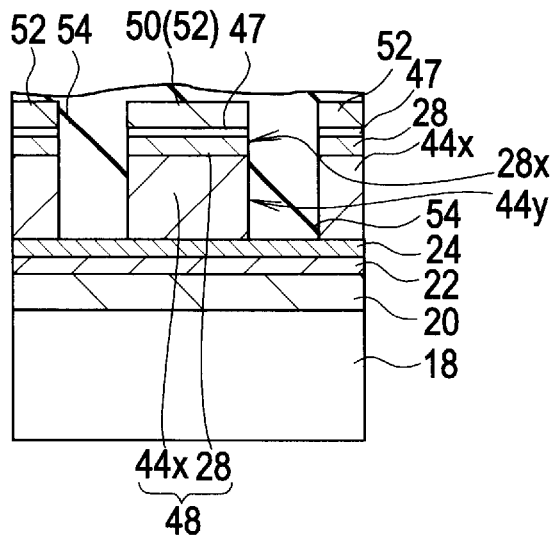
FIGS. 3(A) to (C) are diagrams for explaining the manufacture of the semiconductor laser, continuing from FIG. 2.

An insulating material is then deposited so as to cover the preliminary pattern 48 and the second conductivity type etching stop layer 24 exposed through the preliminary pattern 48, thereby forming an insulating material layer 54 (FIG. 3(A)).

In this embodiment, a polyimide resin is applied as the insulating material.

Figure 3B:
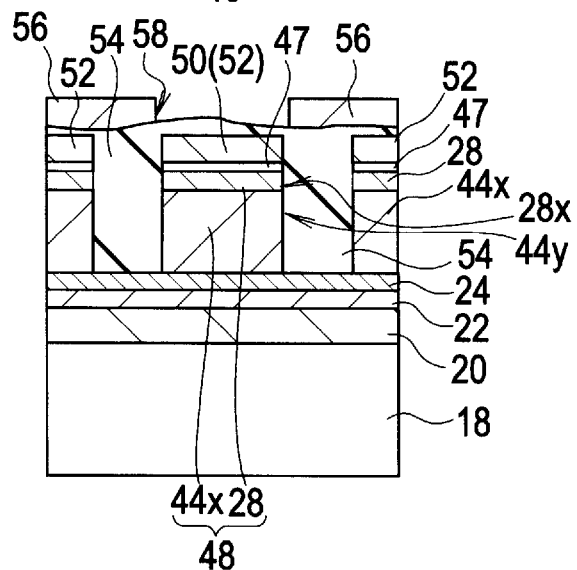

Next, an etching mask 56 is provided as a second mask over the insulating material layer 54 (FIG. 3(B)). This second mask has a window 58 that is wider than the island pattern 50 of the first mask 52. This second mask 56 is provided such that this window 58 is located right over the preliminary pattern 48. As an example, the width of the window 58 in the second mask 56 is 5.2 to 5.3 $\mu$m, which is wider than the mesa width of the preliminary pattern 48 (the stripe pattern with a mesa width of 5 $\mu$m).

A polyimide resin is used as the insulating material in this embodiment, but if the insulating material layer 54 is formed from another insulating material, then a photoresist is deposited over the applied insulating material layer 54, and then a standard photolithography technique is used to form the second mask 56.

Figure 3C:
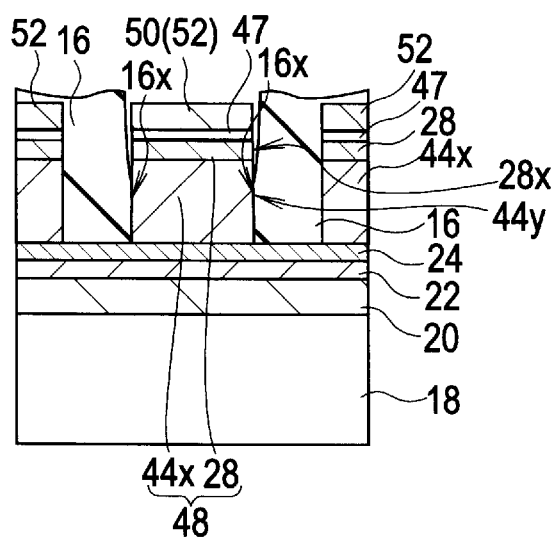

Next, the portion of the insulating material layer 54 exposed through the etching mask 56 is etched away to expose the upper surface of the preliminary pattern 48 and part of the upper part of the side wall of the preliminary pattern 48 (FIG. 3(C)).

Since a polyimide resin is used as the insulating material in this embodiment, part of the insulating material layer 54 can be removed by a standard photolithography technique using the second mask 56 as a photomask. First, exposure is performed through the second mask 56. This makes the portion of the insulating material layer 54 exposed through the window 58 soluble in a developing solution. A developing process is then performed. This exposes the upper surface of the preliminary pattern 48 and the upper part of the side wall of the preliminary pattern.

In this embodiment, the exposed portions are specifically the upper surface and side wall of the first mask 52, the side wall 28x of the remaining portion (second conductivity type contact layer) 28 of the second conductivity type second film, and a part 44y of the side wall of the remaining portion 44x of the second conductivity type first film (FIG. 3(C)).

If, on the other hand, another material is used as the insulating material, the portion of the insulating material layer 54 exposed through the window 58 of the second mask (etching mask) 56 formed by the above-mentioned photolithography and etching is etched away until the upper portion of the side wall 44y of the preliminary pattern 48 appears. Just as in the present embodiment, this etching exposes the upper surface and side wall of the first mask 52 located under the window 58, the side wall 28x of the remaining portion (second conductivity type contact layer) 28 of the second conductivity type second film, and a part 44y of the side wall of the remaining portion 44x of the second conductivity type first film (FIG. 3(C)).

In this embodiment the window 58 formed in the etching mask 56 is formed wider than the island pattern 50 of the first mask. Basically, the width of this window 58 should be sufficient to allow the area around the upper part of the preliminary pattern 48 to be etched away. Here, the width of the window 58 was set such that the above-mentioned side wall 28x of the p-InGaAs contact layer 28 of the preliminary pattern 48, and a part 44y of the side wall of the remaining portion 44x of the underlying n-type film could be etched.

Figure 4A:
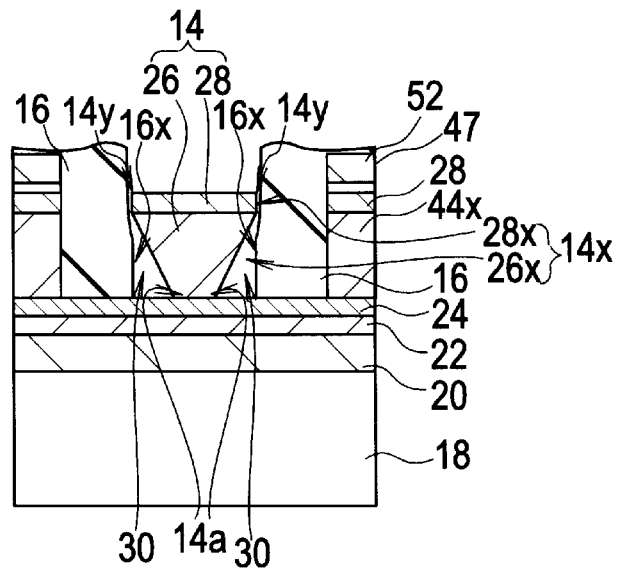
FIGS. 4(A) to (C) are diagrams for explaining the manufacture of the semiconductor laser, continuing from FIG. 3.

Next, the remaining insulating material layer 54 (polyimide resin film 16) is cured, after which the entire side wall of the preliminary pattern 48 is subjected to anisotropic wet etching from part of the side wall of the exposed preliminary pattern 48, forming the reversed-mesa structure component 14 (FIG. 4(A)).

First, the remaining insulating material layer 54 (polyimide resin film 16) is cured by a suitable method. Then, anisotropic wet etching is performed on the exposed surface of a part 44y of the side wall of the remaining portion 44x of the second conductivity type first film. This results in the remaining portion 44x being etched in the direction parallel to the underlying surface, with the etching increasing towards the underlying surface, yielding the reversed-mesa second conductivity type cladding layer 26 (FIG. 4(A)).

Thus, in this embodiment, the remaining polyimide resin film 16 is first heat treated and cured at a temperature of 350° C. Since this heat treatment causes the polyimide resin to undergo thermal expansion, and stress is applied and strain occurs in the vicinity of the boundary between the etching stop layer 24 and the remaining portion 44x of the p-InP film. After this, this structure is wet etched using an etchant composed of a mixed solution of acetic acid and hydrogen bromide. This starts the etching from a part 44y of the side wall of the remaining portion 44x of the p-InP film exposed through the polyimide resin film 16. The above-mentioned etchant is an anisotropic etchant that etches the side wall of the remaining portion 44x of the p-InP film toward the (111) A plane. Therefore, this etching causes the remaining portion 44x of the p-InP film to become the p-InP cladding layer 26 with a reversed-mesa structure. This is accompanied by the formation of the space 30 between the side wall 26x of the p-InP cladding layer 26 and the polyimide resin film (the insulating material component 16). Thus, the strain in the vicinity of the boundary between the etching stop layer 24 and the remaining portion 44x of the p-InP film generated by thermal expansion in the course of curing the polyimide resin can be eliminated.

Figure 4B:
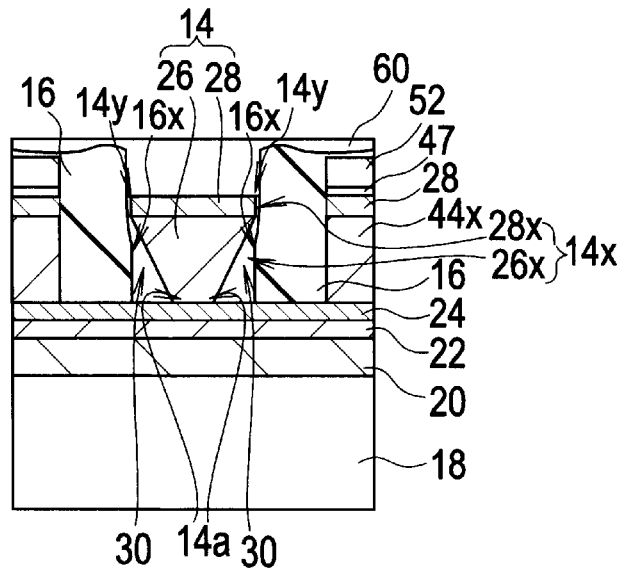
Figure 4C:
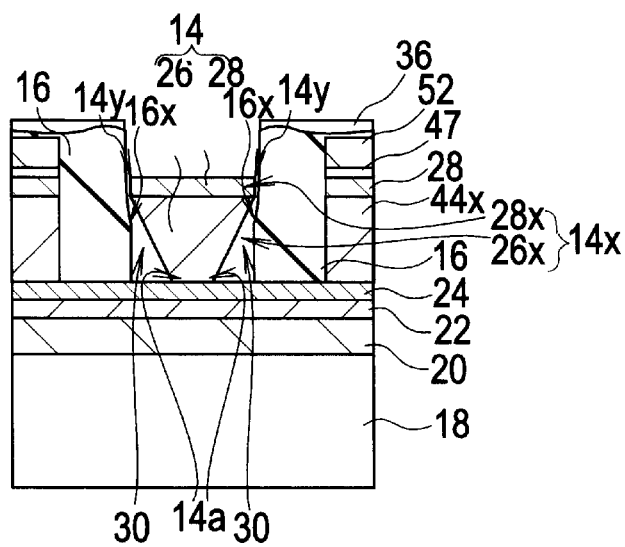

Next, in this embodiment, an $SiO_2$ film 60 is formed over the entire upper surface of the structure using p-CVD from the top side of the structure (FIG. 4(B)). It is conceivable here that the $SiO_2$ might work its way into the space between the p-InGaAs contact layer 28 and the polyimide resin film 16, but this poses no problem in terms of the operation of the device.

The $SiO_2$ film 60 formed on the upper surface of the p-InGaAs contact layer 28 is then removed. To this end, the $SiO_2$ film 60 on the p-InGaAs contact layer 28 is removed by a known photolithography treatment and subsequent etching. Thus, the $SiO_2$ insulating film 36 remains only on the polyimide resin film 16 (FIG. 4(C)).

After this, Au/Zn/Au is vapor deposited as the ohmic electrode 34 on the upper surface of the p-InGaAs contact layer 28, after which Ti/Pt/Au is vapor deposited over this as the electrode pad 32.

Next, the back side 18x of the n-InP substrate 18 is polished so that the thickness of the overall device is about 100 μm. After this, Au/Ge/Ni is vapor deposited as the ohmic electrode 38 on the back side 18x of this n-InP substrate 18, and then Ti/Pt/Au is vapor deposited as the electrode pad 40.

This yields the semiconductor laser 10 shown in FIG. 1.

As a result, strain generated in the preliminary pattern 48 can be eliminated by performing anisotropic wet etching and changing the preliminary pattern 48 into the reversed-mesa structure component 14. This affords higher reliability of the resulting device 10. Also, since the space 30 surrounds the reversed-mesa structure component 14, there is a reduction in the parasitic capacitance of the device as compared to when this component 14 is covered with a polyimide resin film. Also, the polyimide resin film 16 is provided close to the sides near the upper surface of the reversed-mesa structure component 14 of this device 10, and therefore the surface of the device 10 is substantially flattened by this polyimide resin film 16. Thus, the strength when the device is mounted is higher than that with a semiconductor laser with an air bridge structure, for instance. This means that the device yield will be higher.

In this embodiment, the reversed-mesa structure component consisted of a second conductivity type cladding layer and a second conductivity type contact layer, but it is not limited to this configuration. In the configuration of the semiconductor optical functional device of this embodiment, for example, there may be a reversed-mesa structure component comprising a second conductivity type contact layer, a second conductivity type cladding layer, and an active layer, or there may be a reversed-mesa structure component comprising a second conductivity type contact layer, a second conductivity type cladding layer, an active layer, and a first conductivity type cladding layer. In a case such as this, of the layers that make up the reversed-mesa structure component, the etching stop layer is formed directly under the layer closest to the substrate.

Also, the example given in this embodiment was one of an InGaAsP-InP semiconductor laser with a 1.3 μm band, but the structured to which the present invention is applied is not limited to this. Other materials can be used, or the laser can have a different wavelength band, or the invention can be applied to another semiconductor optical functional device such as a light modulator, an LED, a photodiode, a photo-amplifier, or an optical waveguide, and can be applied to a device having a ridge structure. The present invention can also be applied to an optical device in which different semiconductor optical functional devices are integrated, such as a semiconductor laser equipped with a light modulator.

What is claimed is:

1. A method for manufacturing a semiconductor optical functional device, comprising:
   forming a laminated semiconductor layer over a substrate;
   forming an island-form preliminary pattern whose side wall surface is substantially perpendicular to the upper surface of the substrate by patterning all or part of the laminated semiconductor layer;
   forming an insulating material component on the top side of the substrate so that the upper surface of the preliminary pattern and part of the side walls of said preliminary pattern are exposed; and
   etching the side walls of the preliminary pattern and thereby changing said preliminary pattern into a reversed-mesa structure component that contributes to optical function and forming a space between said reversed-mesa structure component and the insulating material component.

2. The method for manufacturing a semiconductor optical functional device according to claim 1, said forming of the insulating material component including:
   forming an insulating material layer on the top side of the substrate so as to cover the preliminary pattern;
   etching the insulating material layer so that part of the upper surface of the preliminary pattern and part of the side wall surface on both sides will be exposed; and
   obtaining the insulating material component by curing the remaining portion of the insulating material layer, and said forming of the space including:
   performing wet etching on the entire side wall surface from part of the side wall surface of the exposed preliminary pattern.

3. The method for manufacturing a semiconductor optical functional device according to claim 2, wherein said etching of the insulating material layer is performed using a mask provided over the insulating material layer, and
   said mask has a window that is wider than the preliminary pattern, and is provided at a location where the ends of the preliminary pattern in its lateral direction are exposed through said window.

4. The method for manufacturing a semiconductor optical functional device according to claim 3, wherein the width of the window is such that part of the side wall surfaces on both sides of the preliminary pattern can be exposed when the mask is used to etch the insulating material layer, and such that the insulating material layer can remain to the extent that there is no increase in the overall volume of the device after etching.

5. A method for manufacturing a semiconductor optical functional device, comprising:

building up a first conductivity type cladding layer, an active layer, a second conductivity type etching stop layer, a second conductivity type first film, and a second conductivity type second film in that order over a first conductivity type substrate;

providing a first mask that covers a second conductivity type contact layer formation region over said second conductivity type second film, and then using the first mask to perform etching until the upper surface of the second conductivity type etching stop layer is exposed, thereby forming a preliminary pattern whose side wall surface is substantially perpendicular to the upper surface of the etching stop layer and which includes the remaining portion of the second conductivity type first film and the second conductivity type contact layer composed of the remaining portion of the second conductivity type second film;

forming an insulating material layer by building up an insulating material over the second conductivity type etching stop layer so as to cover the preliminary pattern;

providing a second mask, in which a window has been formed at a location directly over the first mask, over the insulating material layer;

etching away the portion of the insulating material layer exposed through the window in the second mask, thereby exposing part of the side wall of the remaining portion of the second conductivity type first film, the side wall of the second conductivity type contact layer, and the upper surface and side wall of the first mask;

forming an insulating material component by curing the remaining portion of the insulating material layer; and performing anisotropic wet etching on the entire side wall of the remaining portion of the exposed second conductivity type first film from part of said side wall, so as to change the remaining portion of the second conductivity type first film into a reversed-mesa type of second conductivity type cladding layer, thereby forming a reversed-mesa structure component including said second conductivity type cladding layer and the second conductivity type contact layer, the window in the second mask being wider than the upper surface of the first mask.

6. The method for manufacturing a semiconductor optical functional device according to claim 5, wherein the insulating material is a polyimide resin.

7. The method for manufacturing a semiconductor optical functional device according to claim 5, wherein the width of the window in the second mask is such that part of the side wall surfaces on both sides of the remaining portion of the second conductivity type first film can be exposed when the second mask is used to etch the insulating material layer, and such that the insulating material layer can remain to the extent that there is no increase in the overall volume of the device after etching.

* * * * *